(12) United States Patent
Chang et al.

(10) Patent No.: US 9,257,497 B2
(45) Date of Patent: Feb. 9, 2016

(54) METAL-INSULATOR-METAL (MIM) CAPACITOR TECHNIQUES

(71) Applicant: Taiwan Semiconductor Manufacturing Co., Ltd., Hsin-Chu (TW)

(72) Inventors: Yao-Wen Chang, Taipei (TW); Hsing-Lien Lin, Hsin-Chu (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/242,227

(22) Filed: Apr. 1, 2014

(65) Prior Publication Data

US 2015/0187864 A1    Jul. 2, 2015

Related U.S. Application Data

(60) Provisional application No. 61/922,489, filed on Dec. 31, 2013.

(51) Int. Cl.
*H01L 21/02* (2006.01)
*H01L 49/02* (2006.01)
*H01L 29/16* (2006.01)

(52) U.S. Cl.
CPC ............ *H01L 28/60* (2013.01); *H01L 29/1608* (2013.01)

(58) Field of Classification Search
CPC ............... H01L 2924/00; H01L 2924/00014; H01L 2924/0002; H01L 2224/32225; H01L 2224/73265; H01L 27/1225; H01L 27/1156; H01L 29/7869
See application file for complete search history.

(56) References Cited

U.S. PATENT DOCUMENTS

| | | | |
|---|---|---|---|
| 7,160,772 B2 * | 1/2007 | Coolbaugh et al. | 438/243 |
| 8,618,635 B2 * | 12/2013 | Kim et al. | 257/535 |
| 2007/0045702 A1 * | 3/2007 | Liang | 257/306 |
| 2013/0285201 A1 | 10/2013 | Zhang et al. | |

OTHER PUBLICATIONS

Chen, et al. "High-Performance MIM Capacitor Using ZrO2/Al2O3/ZrO2 Dielectric." 214th ECS Meeting, Abstract #246, Oct. 2008.

* cited by examiner

*Primary Examiner* — Tony Tran
(74) *Attorney, Agent, or Firm* — Eschweiler & Associates, LLC

(57) ABSTRACT

Some embodiments relate to a metal-insulator-metal (MIM) capacitor. The MIM capacitor includes a capacitor bottom metal (CBM) electrode, a high-k dielectric layer arranged over the CBM electrode, and a capacitor top metal (CTM) electrode arranged over the high-k dielectric layer. A capping layer is arranged over the CTM electrode. A lower surface of the capping layer and an upper surface of the CTM electrode meet at an interface. Protective sidewalls are adjacent to outer sidewalls of the CTM electrode. The protective sidewalls have upper surfaces at least substantially aligned to the interface at which the upper surface of the CTM electrode meets the lower surface of the capping layer.

20 Claims, 4 Drawing Sheets

METAL-INSULATOR-METAL (MIM) CAPACITOR TECHNIQUES

REFERENCE TO RELATED APPLICATIONS

The present application claims priority to U.S. provisional application filed on Dec. 31, 2013, which has an Application No. of 61/922,489 and is entitled "Metal-Insulator-Metal (MIM) Capacitor Techniques", the contents of which are incorporated by reference herein in their entirety.

BACKGROUND

A capacitor is a passive two-terminal electrical component used to store energy electro-statically in an electric field. The forms of practical capacitors vary widely, but all contain at least two electrical conductors separated by a dielectric (insulator). Capacitors are widely used as parts of electrical circuits in many common electrical devices. For example, capacitors are widely used in electronic circuits for blocking direct current while allowing alternating current to pass, but can also be used to store data states, such as in a dynamic random access memory (DRAM) device.

For integrated circuits and for DRAM devices in particular, the use of metal-insulator-metal (MIM) capacitors has become widespread in recent years.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
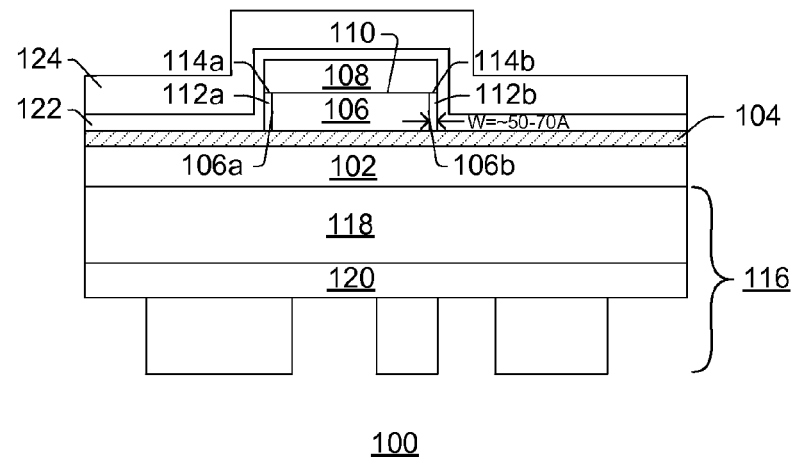
FIG. 1 illustrates a cross-sectional view of an MIM capacitor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows some embodiments of a metal-insulator-metal (MIM) capacitor 100. The MIM capacitor 100 includes a capacitor bottom metal (CBM) electrode 102, a high-k dielectric layer 104, and a capacitor top metal (CTM) electrode 106. A capping layer 108 is arranged over the CTM electrode 106. A lower surface of the capping layer 108 and an upper surface of the CTM electrode 106 meet at an interface 110.

As has been appreciated in the present disclosure, conventional MIM capacitors are susceptible to a mode of failure known as premature voltage breakdown or burn out. This mode of failure can be caused for example by residue on the CTM sidewall or damage to the CTM sidewall from an etch used to form the CTM. More particularly, this residue or etch damage can lead to shorts or narrow vertical pathways in outer edges of the high-k dielectric layer between the CTM and CBM. Hence, when a voltage is applied across the CTM and CBM during normal operation, the voltage can tend to surge through these shorts or narrow pathways, causing premature voltage failure or burn out of the device. Moreover, because this residue or etch damage occurred only for some devices due to small manufacturing variation between the devices, the precise nature of this problem had been difficult to understand, let alone mitigate, until the present disclosure.

To protect the MIM capacitor 100 from this premature voltage breakdown or burn out, the MIM capacitor includes protective sidewalls 112a, 112b. These protective sidewalls are adjacent to outer sidewalls of the CTM electrode, and are arranged to underlie a bottom surface of the capping layer 108. The protective sidewalls act as a barrier or buffer to prevent or limit residue from the CTM sidewall from damaging the high-k dielectric layer 104 between the CTM and CBM electrodes. The protective sidewalls 112a, 112b also act as a barrier or buffer to prevent damage to the CTM sidewall, and to prevent corresponding damage-susceptibility to the high-k dielectric when an etch is used to form the CTM.

In some embodiments, the protective sidewalls 112a, 112b have upper surfaces 114a, 114b which are at least substantially aligned to an upper surface of CTM electrode 106 and/or which are at least substantially aligned to interface 110.

In some embodiments, the CTM electrode 106 is made of a first material that includes a metal component, and the protective sidewalls 112a, 112b are made of a second material that includes the metal component and an oxide component. For example, the CTM electrode 106 can comprise titanium nitride and the protective sidewalls 112a, 112b can comprise titanium oxide nitride. In some embodiments, the CTM electrode 106 can have a thickness or "height" of approximately 600 angstroms, and the protective sidewalls 112a, 112b can each have a width, w, of approximately 50 angstroms to approximately 70 angstroms. In some implementations, the CBM electrode 102 can also comprise TiN, and can have a thickness of 400 angstroms for example.

In some embodiments, the capping layer 108 comprises a SiON layer, and can have a thickness of approximately 300 angstroms.

In some embodiments, the high k dielectric layer 104 is a ZrO2-Al2O3-ZrO2 (ZAZ) laminate layer, which can extend continuously over the CBM electrode 102. As shown, the CTM electrode 106 overlies less than all of the CBM electrode 102, thereby giving the MIM capacitor 100 a "top-hat" shape in some regards.

The CBM electrode 102 can be formed over a semiconductor substrate 116. In the illustrated implementation, the semiconductor substrate 116 includes a poly (2-ethyl-2-oxazoline) (PEOX) layer 118, which can have a thickness of approximately 1000 angstroms. The PEOX layer 118 is formed over a SiC layer 120, which can have a thickness of approximately 550 Angstroms. It will be appreciated that the semiconductor substrate 116 may comprise any type of semiconductor material including a bulk silicon wafer, a binary compound substrate (e.g., GaAs wafer), or higher order compound substrates, with or without additional insulating or conducting layers formed there over, among others; and is not limited to the illustrated layers.

An etch stop layer 122 conformally overlies the capping layer 108, the protective sidewalls 112, and portions of the high-k dielectric layer 104 that are not covered by the CTM electrode 106. In some embodiments, the etch stop layer 122 comprises SiO2. A SiN layer 124 conformally overlies the etch stop layer 122.

Figure 2:
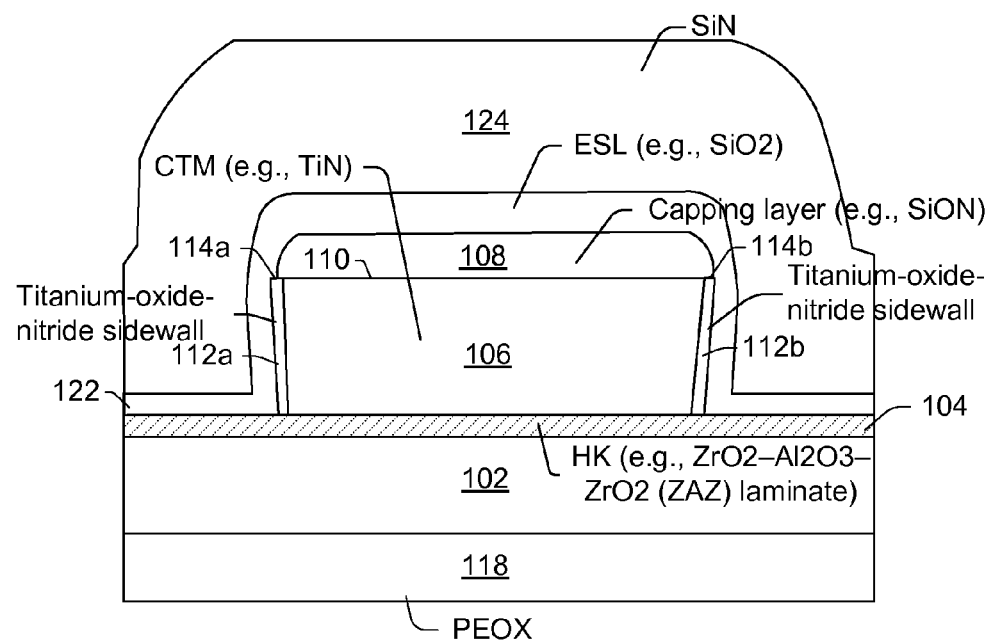
FIG. 2 illustrates a cross-sectional view of a MIM capacitor in accordance with some embodiments.

FIG. 2 shows one example of a cross-sectional view of an MIM capacitor 200. There is nothing in this image that should be construed as limiting, but rather it is provided only as a non-limiting example. Like FIG. 1's embodiment, MIM capacitor 200 includes protective sidewalls 112a, 112b. These protective sidewalls are adjacent to outer sidewalls of the CTM electrode 106, and are arranged to underlie a bottom surface of the capping layer 108. The protective sidewalls act as a barrier or buffer to prevent or limit residue from the CTM 106 sidewall from damaging the high-k dielectric layer 104 between the CTM and CBM electrodes. The protective sidewalls also act as a barrier or buffer to prevent damage to the CTM sidewall, and to prevent corresponding damage-susceptibility to the high-k dielectric when an etch is used to form the CTM.

Figure 3:
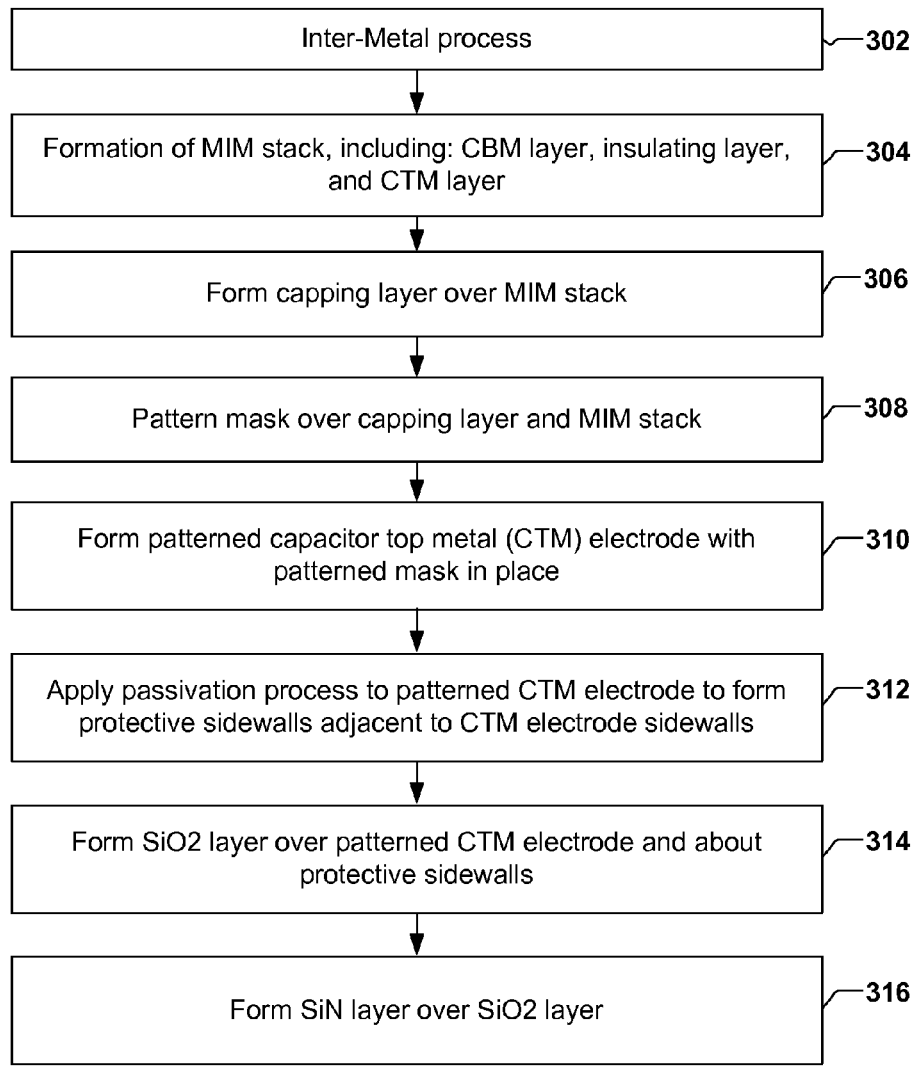
FIG. 3 illustrates a process flow in flow chart format in accordance with some embodiments.

FIG. 3 shows a methodology for forming a MIM capacitor in accordance with some embodiments. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

In 302, an inter-metal process is used to form metal interconnect, such as alternating metal and insulating layers which are formed one on top of another, over a semiconductor substrate. In some embodiments the semiconductor substrate is a silicon substrate. However, the semiconductor substrate in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate can also include non-semiconductor materials such as oxide in silicon-on-insulator (SOI), partial SOI substrate, polysilicon, amorphous silicon, or organic materials, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g., epitaxial) layers formed on an underlying substrate.

In 304, a stack of MIM layers are formed in or over the metal interconnect. The MIM layers include a CBM layer, an insulating layer over the CBM layer, and a CTM layer over the insulating layer.

In 306, a capping layer is formed over the MIM stack.

In 308, a mask is patterned over the capping layer and the MIM stack.

In 310, an etch is carried out with the mask in place, thereby patterning the CTM electrode.

In 312, a passivation process is applied to the patterned CTM electrode to form protective sidewalls adjacent to outer sidewalls of the CTM electrode.

In 314, an SiO2 layer is formed over the patterned CTM electrode and over the protective sidewalls.

In 316, a SiN layer is formed over the SiO2 layer.

Turning now to FIGS. 4-10, one can see a series of cross-sectional views that collectively depict an MIM capacitor manufacturing process in accordance with some embodiments.

Figure 4:
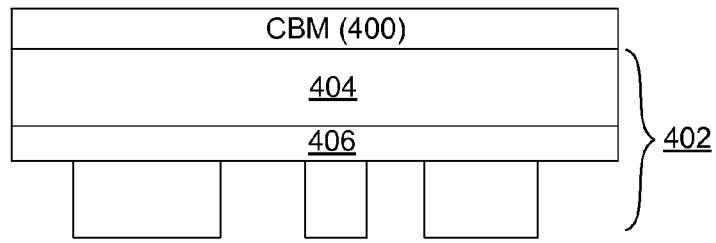
FIGS. 4-10 are a series of cross-sectional views that collectively depict an embodiment for manufacturing an MIM capacitor in accordance with some embodiments.

In FIG. 4, a CBM electrode layer 400 is formed over a semiconductor substrate 402. The CBM electrode layer 400 can comprise TiN, and can have a thickness of approximately 400 Angstroms in some embodiments. In some embodiments, the semiconductor substrate 402 can include a Poly (2-ethyl-2-oxazoline) (PEOX) layer 404 and an underlying SiC layer 406.

Figure 5:
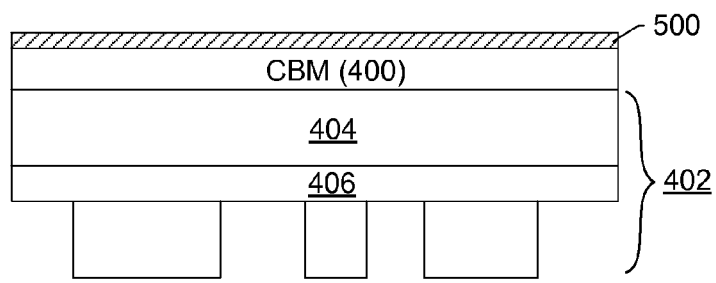

In FIG. 5, a high-k dielectric layer 500 is formed over the CBM electrode layer 400. In some embodiments, the high-k dielectric layer 500 is a ZAZ laminate. For example, the ZAZ laminate can comprise alternating layers of ZrO2/Al2O3/ZrO2.

Figure 6:
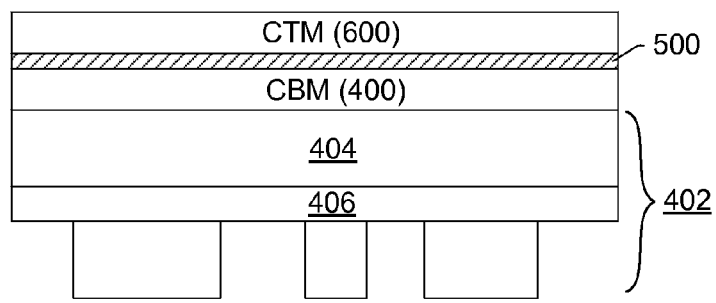

In FIG. 6, a CTM electrode layer 600 is formed over the high-k dielectric layer 500. The CTM electrode layer 600 can comprise TiN, and can have a thickness of approximately 600 Angstroms in some embodiments.

Figure 7:
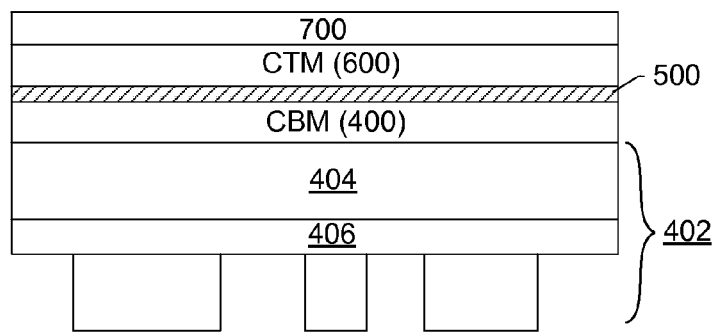

In FIG. 7, a capping layer 700 is formed over the CTM layer 600. The capping layer 700 can comprise SiON, and can have a thickness of approximately 300 angstroms in some embodiments.

Figure 8:
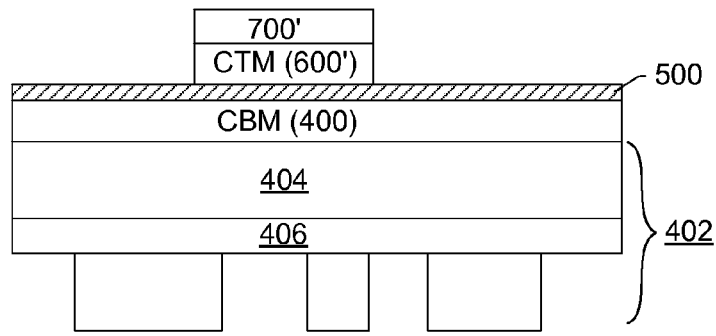

In FIG. 8, a CTM mask (not shown) is patterned over the capping layer 700, and then an etch is carried out with the CTM mask in place to form a patterned CTM electrode 600' with a patterned capping layer 700' there over.

Figure 9:
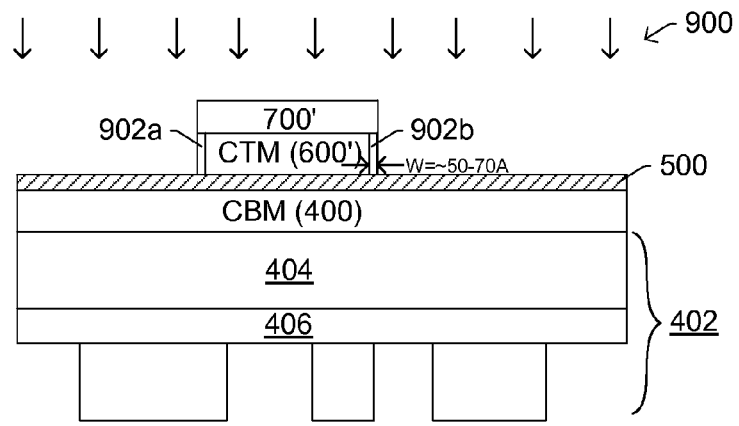

In FIG. 9, a passivation process 900 is carried out on the patterned CTM electrode 600' and patterned capping layer 700'. Although not expressly illustrated, the CTM mask can be left in place over the patterned capping layer during passivation in some instances, but in other instances the mask can be removed prior to passivation. The passivation process 900 forms protective sidewalls 902a, 902b adjacent to outer CTM sidewalls. The passivation process can comprise an $O_3$ treatment or an $N_2O$ treatment to oxidize outermost CTM sidewalls, thereby forming protective sidewalls 902a, 902b. The protective sidewalls 902a, 902b can each have a width of approximately 50 angstroms to approximately 70 angstroms and can each have an upper surface that meets a lower surface of the capping layer 700'. The protective sidewalls 902a, 902b can also have lower surfaces that meet an upper surface of high-k dielectric layer 500. In other embodiments, the protective sidewalls 902a, 902b can extend upwards at least partially impinge on or extend over the capping layer sidewalls, and/or can extend downwards at least partially into the high-k dielectric.

Figure 10:
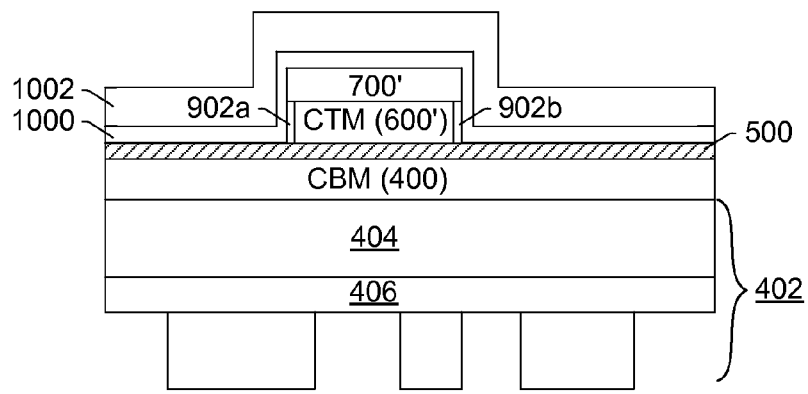

In FIG. 10, after the passivation process is carried out, an SiO2 layer 1000 is conformally formed over the structure. A SiN layer 1002 is then formed over the $SiO_2$ layer 1000.

Some embodiments relate to a metal-insulator-metal (MIM) capacitor. The MIM capacitor includes a capacitor bottom metal (CBM) electrode, a high-k dielectric layer arranged over the CBM electrode, and a capacitor top metal (CTM) electrode arranged over the high-k dielectric layer. A capping layer is arranged over the CTM electrode. A lower surface of the capping layer and an upper surface of the CTM electrode meet at an interface. Protective sidewalls are adjacent to outer sidewalls of the CTM electrode. The protective sidewalls have upper surfaces at least substantially aligned to the interface at which the upper surface of the CTM electrode meets the lower surface of the capping layer.

Other embodiments relate to a method. In the method, a MIM capacitor stack is formed. The MIM capacitor stack includes: a capacitor bottom metal (CBM) electrode layer, dielectric layer, and a capacitor top metal (CTM) electrode layer. A mask is patterned over the CTM electrode layer. An etch is performed with the mask in place over the CTM electrode layer to form a patterned capacitor top metal (CTM) electrode. A passivation process is applied to form protective sidewalls on sidewalls of the CTM electrode.

Yet other embodiments relate to a metal-insulator-metal (MIM) capacitor. The MIM capacitor includes a capacitor bottom metal (CBM) electrode, a high-k dielectric layer arranged over the CBM electrode, and a capacitor top metal (CTM) electrode arranged over the high-k dielectric layer. Protective sidewalls are adjacent to outer sidewalls of the CTM electrode. The protective sidewalls have upper surfaces at least substantially aligned to an upper surface of the CTM electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor, comprising:
a capacitor bottom metal (CBM) electrode;
a high-k dielectric layer arranged over the CBM electrode;
a capacitor top metal (CTM) electrode arranged over the high-k dielectric layer, wherein a lowermost surface of the CTM electrode directly adjoins an upper surface of the high-k dielectric layer;
a dielectric capping layer arranged over the CTM electrode, wherein a lower surface of the dielectric capping layer and an upper surface of the CTM electrode meet at an interface; and
protective sidewalls made of a passivation material adjacent to outer sidewalls of the CTM electrode, the passivation material of the protective sidewalls having an upper surface aligned to the interface at which the upper surface of the CTM electrode meets the lower surface of the capping layer and having a lower surface which directly adjoins the upper surface of the high-k dielectric layer and does not extend under the lowermost surface of the CTM electrode.

2. The MIM capacitor of claim 1, wherein the CTM electrode is made of an un-oxidized state of a metal compound and the passivation material of the protective sidewalls is an oxidized state of the metal compound.

3. The MIM capacitor of claim 1, wherein the CTM electrode comprises titanium nitride and the protective sidewalls comprise titanium oxide nitride.

4. The MIM capacitor of claim 1, wherein the protective sidewalls have a width ranging from 50 angstroms to 70 angstroms, as measured perpendicularly from an outer surface of an outer sidewall of the CTM electrode.

5. The MIM capacitor of claim 1, wherein the high-K dielectric layer comprises $ZrO_2$-$Al_2O_3$-$ZrO_2$ (ZAZ).

6. The MIM capacitor of claim 5, wherein the CBM electrode comprises titanium nitride.

7. The MIM capacitor of claim 1, wherein the high-k dielectric layer extends continuously over the CBM electrode, and wherein the CTM electrode overlies less than all of the CBM electrode.

8. The MIM capacitor of claim 1, wherein the dielectric capping layer comprises an SiON layer.

9. The MIM capacitor of claim 1, further comprising:
an etch stop layer conformally overlying: the dielectric capping layer, the protective sidewalls, and portions of the high-k dielectric layer that are not covered by the CTM electrode.

10. The MIM capacitor of claim 1, wherein the dielectric capping layer has outer sidewalls which are aligned directly over the passivation material of the protective sidewalls.

11. A metal-insulator-metal (MIM) capacitor, comprising:
a capacitor bottom metal (CBM) electrode;
a high-k dielectric layer arranged over the CBM electrode;
a capacitor top metal (CTM) electrode arranged over the high-k dielectric layer wherein a lowermost surface of the CTM electrode and an upper surface of the high-k dielectric layer directly adjoin one another; and
protective sidewalls made of a passivation material adjacent to outer sidewalls of the CTM electrode, the passivation material of the protective sidewalls having an upper surface aligned to an upper surface of the CTM electrode and having a lower surface which directly adjoins the upper surface of the high-k dielectric layer and which does not extend under the lowermost surface of the CTM electrode.

12. The MIM capacitor of claim 11, wherein the CTM electrode layer is made of a first material that includes a metal component, and wherein the protective sidewalls are made of a second material that includes the metal component and an oxide component.

13. The MIM capacitor of claim 11, wherein the CTM electrode comprises titanium nitride and the protective sidewalls comprise titanium oxide nitride.

14. A metal-insulator-metal (MIM) capacitor, comprising:
a capacitor bottom metal (CBM) electrode;
a high-k dielectric layer arranged over the CBM electrode;
a capacitor top metal (CTM) electrode arranged over the high-k dielectric layer, wherein a lowermost surface of the CTM electrode directly adjoins an upper surface of the high-k dielectric layer;
a dielectric capping layer arranged directly over the CTM electrode and having a width that is greater than a width of the CTM electrode, wherein a lower surface of the dielectric capping layer and an upper surface of the CTM electrode meet at an interface and where dielectric capping layer sidewalls extend laterally beyond corresponding CTM sidewalls so the dielectric capping layer overhangs the CTM electrode; and
protective sidewalls made of a passivation material lining outer sidewalls of the CTM electrode and disposed directly under the overhang of the dielectric capping layer, the passivation material of the protective sidewalls having an upper surface aligned to the interface at which the upper surface of the CTM electrode meets the lower surface of the dielectric capping layer and having a lower surface which directly adjoins the upper surface of the high-k dielectric layer and which does not extend under the lowermost surface of the CTM electrode;
wherein the CTM electrode is made of a first material that includes a metal component, and wherein the protective sidewalls are made of a second material that includes the metal component and an oxide component.

15. The MIM capacitor of claim 14, wherein the CTM electrode has CTM sidewalls that are angled at an angle other than ninety-degrees relative to a top surface of the high-k dielectric layer.

16. The MIM capacitor of claim 14, wherein the dielectric capping layer has sidewalls that taper inwardly to meet an upper surface of the capping layer.

17. The MIM capacitor of claim 14, further comprising:
an etch stop layer conformally overlying: the dielectric capping layer, the protective sidewalls, and portions of the high-k dielectric layer that are not covered by the CTM electrode.

18. The MIM capacitor of claim 17, further comprising:
a SiN layer conformally overlying the etch stop layer.

19. The MIM capacitor of claim 18, wherein the CBM electrode is made of TiN, the CTM electrode is made of TiN, the protective sidewalls are made of TiON, and the etch stop layer is made of silicon dioxide.

20. The MIM capacitor of claim 18, wherein the CBM electrode is disposed over a semiconductor substrate, the semiconductor substrate comprising:
a silicon carbide layer; and
a poly (2-ethyl-2-oxazoline) (PEOX) layer between the silicon carbide substrate and the CBM electrode.

* * * * *